United States Patent
Lim et al.

(10) Patent No.: US 9,983,705 B2
(45) Date of Patent: May 29, 2018

(54) CONDUCTIVE STRUCTURE AND MANUFACTURING METHOD THEREFOR

(71) Applicant: LG CHEM, LTD., Seoul (KR)

(72) Inventors: Jin Hyong Lim, Daejeon (KR); Song Ho Jang, Daejeon (KR); Ilha Lee, Daejeon (KR); Ki-Hwan Kim, Daejeon (KR); Yong Chan Kim, Daejeon (KR); Junghwan Yoon, Daejeon (KR); Chan Hyoung Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days. days.

(21) Appl. No.: 15/035,704

(22) PCT Filed: Nov. 20, 2014

(86) PCT No.: PCT/KR2014/011174
§ 371 (c)(1),
(2) Date: May 10, 2016

(87) PCT Pub. No.: WO2015/076572
PCT Pub. Date: May 28, 2015

(65) Prior Publication Data
US 2016/0291712 A1    Oct. 6, 2016

(30) Foreign Application Priority Data
Nov. 20, 2013  (KR) .................. 10-2013-0141349

(51) Int. Cl.
| | | |
|---|---|---|
| G11B 5/64 | (2006.01) | |
| H05K 1/00 | (2006.01) | |
| H01L 31/00 | (2006.01) | |
| G06F 3/041 | (2006.01) | |
| H01L 31/0216 | (2014.01) | |
| H01L 31/0224 | (2006.01) | |
| H05K 1/02 | (2006.01) | |
| H05K 1/09 | (2006.01) | |
| H05K 3/10 | (2006.01) | |
| H05K 3/22 | (2006.01) | |

(52) U.S. Cl.
CPC ........ *G06F 3/041* (2013.01); *H01L 31/02167* (2013.01); *H01L 31/022425* (2013.01); *H05K 1/0274* (2013.01); *H05K 1/09* (2013.01); *H05K 3/10* (2013.01); *H05K 3/22* (2013.01); *G06F 2203/04103* (2013.01)

(58) Field of Classification Search
CPC ................. G06F 2203/04103; G06F 3/041
See application file for complete search history.

(56) References Cited

U.S. PATENT DOCUMENTS

| | | | |
|---|---|---|---|
| 6,344,288 B1 | 2/2002 | Oyama et al. | |
| 2006/0159609 A1* | 7/2006 | Gole | B01J 27/24 423/326 |
| 2012/0097227 A1 | 4/2012 | Lim et al. | |

(Continued)

FOREIGN PATENT DOCUMENTS

| | | |
|---|---|---|
| EP | 1067407 | 1/2001 |
| JP | 2007223332 | 9/2007 |

(Continued)

*Primary Examiner* — Nan-Ying Yang
(74) *Attorney, Agent, or Firm* — Dentons US LLP

(57) ABSTRACT

The present specification provides a conductive structure body and a method for manufacturing the same.

17 Claims, 8 Drawing Sheets

(56) References Cited

U.S. PATENT DOCUMENTS

| | | | |
|---|---|---|---|
| 2012/0241199 A1 | 9/2012 | Kobayashi et al. | |
| 2013/0045362 A1 | 2/2013 | Chang et al. | |
| 2013/0140065 A1* | 6/2013 | Koo | G06F 3/041 |
| | | | 174/256 |
| 2014/0251429 A1 | 9/2014 | Lim et al. | |

FOREIGN PATENT DOCUMENTS

| | | | | |
|---|---|---|---|---|
| KR | 10-2010-0007605 A | 1/2010 | | |
| KR | 10-2012-0114260 A | 10/2012 | | |
| KR | 10-2013-0048134 A | 5/2013 | | |
| KR | 10-1306563 B1 | 9/2013 | | |
| WO | 1999044080 | 9/1999 | | |
| WO | WO 2012121519 A2 * | 9/2012 | ............. | G06F 3/041 |
| WO | 2013/012271 A2 | 1/2013 | | |
| WO | 2013/157858 A2 | 10/2013 | | |

\* cited by examiner

[Fig. 1]
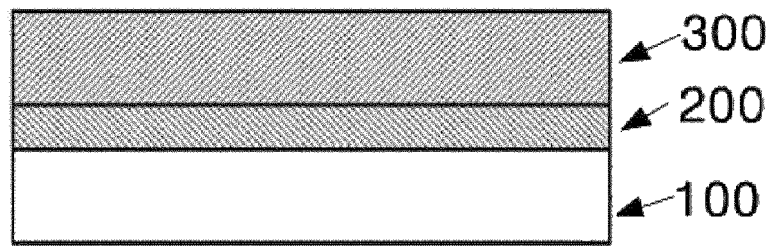
[Fig. 2]
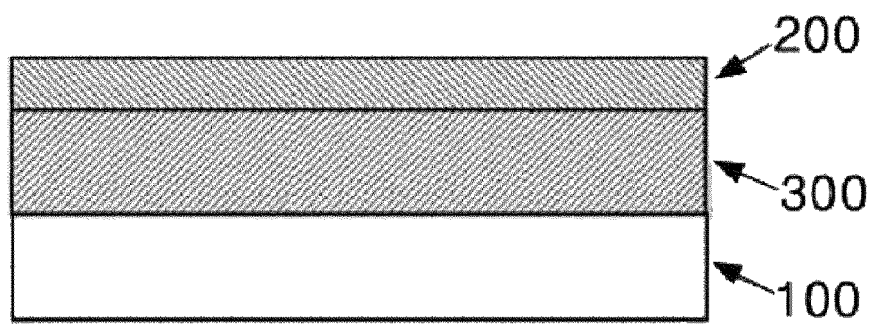
[Fig. 3]
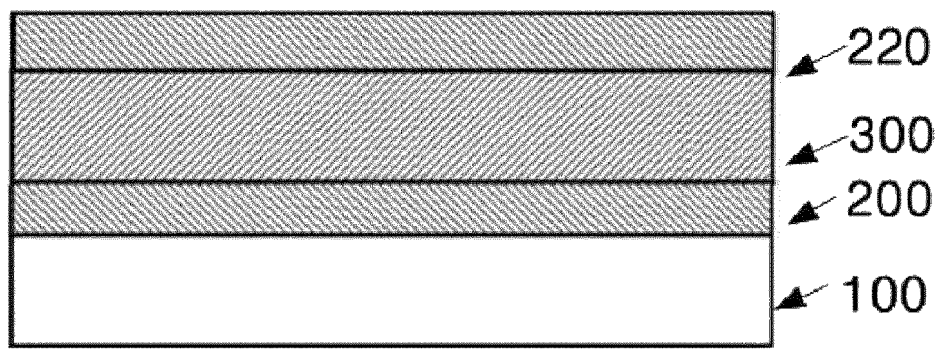

[Fig. 4]
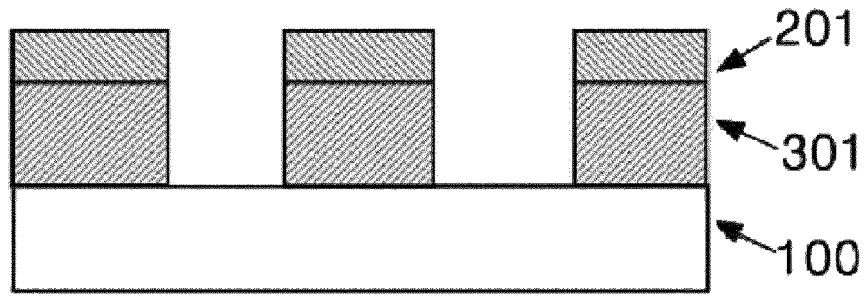
[Fig. 5]
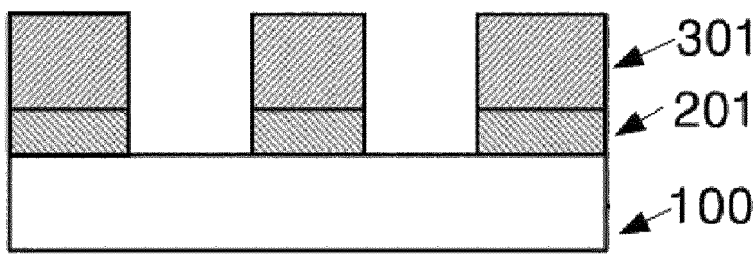
[Fig. 6]
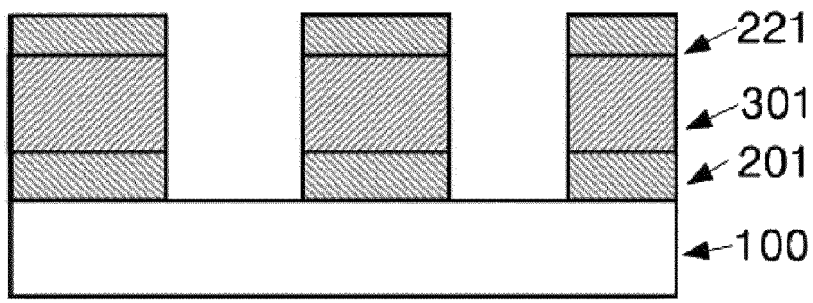

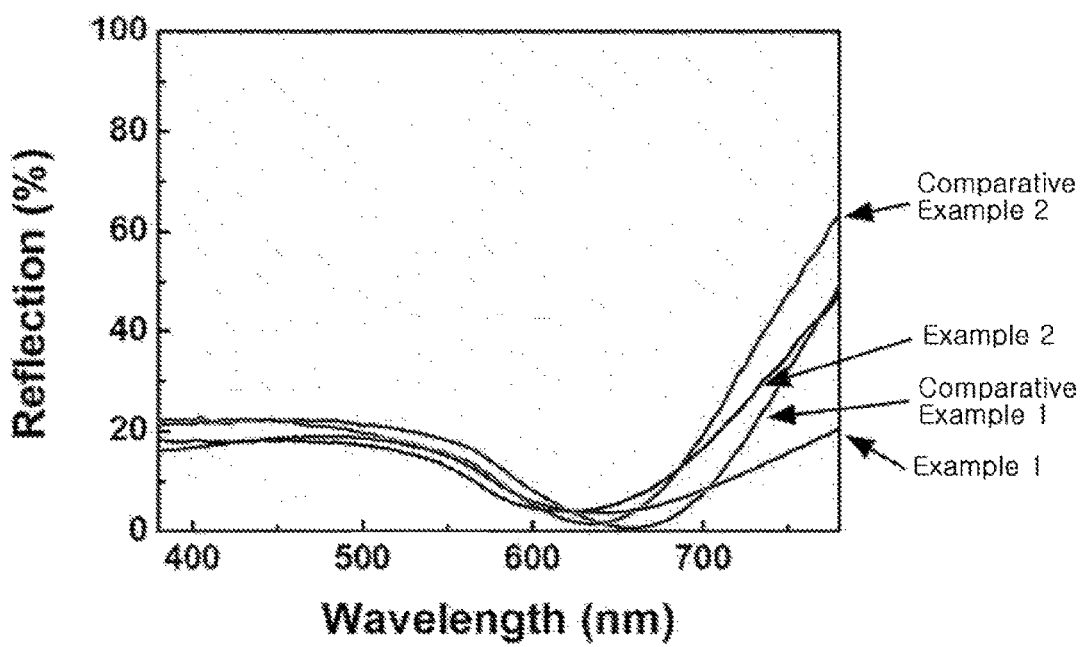
[Fig. 7]

[Fig. 8]
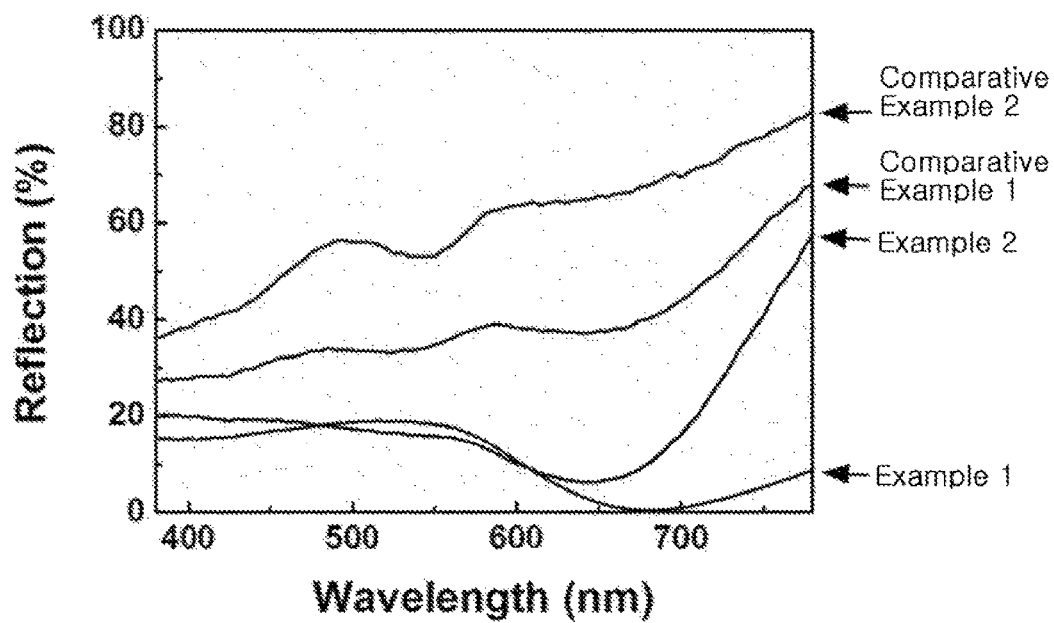

[Fig. 9]
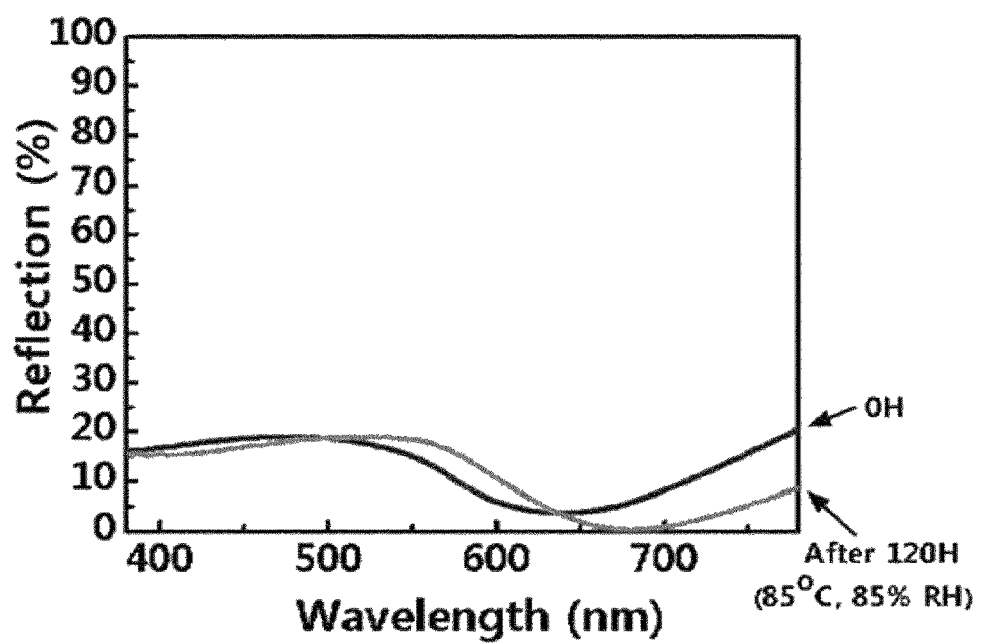

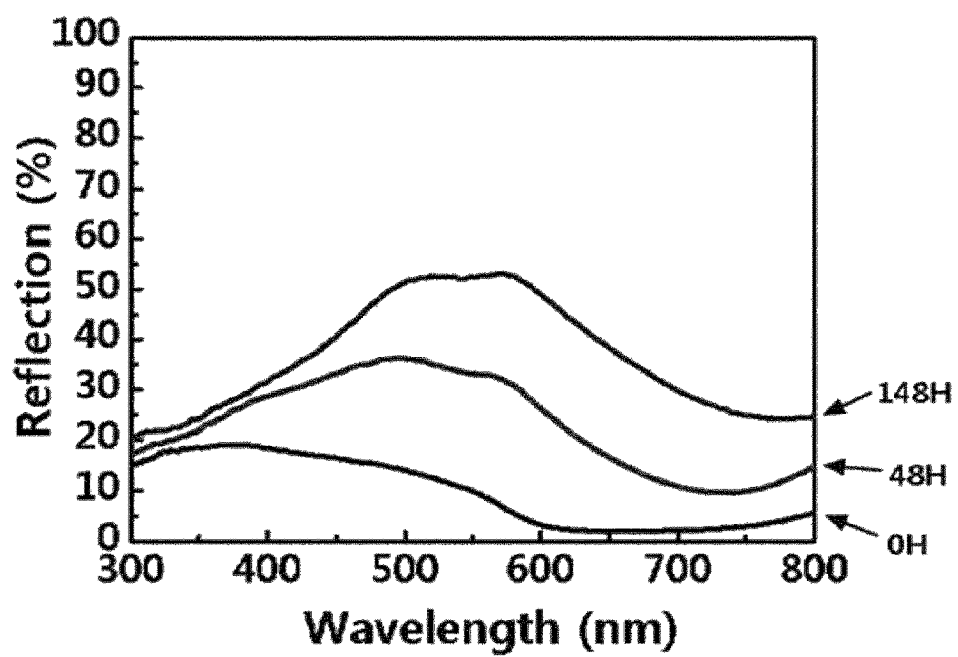
[Fig. 10]

Fig. 11

[Table 1]

| # | x/y/z | Color | | [y/(x-3z)] |
|---|---|---|---|---|
| | | Initial | 85°C/85% 120 hr | |
| Example 1 | 90/5/5 | | | 0.07 |
| Example 2 | 85/3/12 | | | 0.06 |
| Comparative Example 1 | 83/6/11 | | | 0.12 |
| Comparative Example 2 | 81/8/11 | | | 0.16 |

Fig. 12

[Table 3]

| # | OCA Lamination | Color | | Light Reflectivity (%) | |
|---|---|---|---|---|---|
| | | Initial | 85°C/85% 120 hr | Initial | 85°C/85% 120 hr |
| Example 1 | OCA was not laminated | | | 12.9% | 11.0% |
| | OCA was laminated | | | 9.7% | 9.3% |

Fig. 13

[Table 4]

| # | OCA Lamination | Color | | Light Reflectivity (%) | |
|---|---|---|---|---|---|
| | | Initial | 85°C/85% 148 hr | Initial | 85°C/85% 148 hr |
| Comparative Example 3 | OCA was not laminated | | | 8.7% | 39.7% |
| | OCA was laminated | | | 8.2% | 28.1% |

CONDUCTIVE STRUCTURE AND MANUFACTURING METHOD THEREFOR

TECHNICAL FIELD

This application is a National Stage Application of International Application No. PCT/KR2014/011174, filed on Nov. 20, 2014, which claims the benefit of Korean Patent Application No. 10-2013-0141349 filed on Nov. 20, 2013, all of which are hereby incorporated by reference in their entirety for all purposes as if fully set forth herein.

The present specification relates to a conductive structure body and a method for manufacturing the same.

BACKGROUND ART

A touch screen panel is generally divided into as follows depending on the detection methods of signals. In other words, the type includes a resistive type sensing a location pressed by pressure through changes in a current or voltage value while a direct current voltage is applied, a capacitive type using capacitance coupling while an alternating current voltage is applied, and an electromagnetic type sensing a selected location as changes in a voltage while a magnetic field is applied.

As demand for a large-area touch screen panel has recently increased, development of a technology accomplishing a large touch screen panel having excellent visibility while reducing electrode resistance has been required.

DETAILED DESCRIPTION OF THE INVENTION

Technical Problem

An object of the present application is to provide a conductive structure body capable of being used in a touch screen panel, and capable of maintaining excellent visibility while reducing electrode resistance even in a high temperature and high humidity environment.

In addition, another object of the present application is to provide a method for manufacturing the conductive structure body.

The object of the present application is not limited to the technological object mentioned above, and another object that has not been mentioned will be clearly understood by those skilled in the art from the descriptions below.

Technical Solution

One embodiment of the present application provides a conductive structure body including a substrate; a conductive layer provided on the substrate; and a darkening layer provided on at least one surface of the conductive layer, wherein the darkening layer includes a copper nitrate represented by $Cu_xO_yN_z$, and in the copper nitrate, x means an atomic content ratio of Cu, y means an atomic content ratio of O, z means an atomic content ratio of N, and $x>0$, $y>0$, $z>0$, and $[y/(x-3z)]<0.1$.

One embodiment of the present application provides a method for manufacturing a conductive structure body including preparing a conductive layer; forming a darkening layer on at least one surface of the conductive layer; and laminating the conductive layer or the darkening layer with a substrate, wherein the darkening layer includes a copper nitrate represented by $Cu_xO_yN_z$, and in the copper nitrate, x means an atomic content ratio of Cu, y means an atomic content ratio of O, z means an atomic content ratio of N, and $x>0$, $y>0$, $z>0$, and $[y/(x-3z)]<0.1$.

One embodiment of the present application provides a method for manufacturing a conductive structure body including forming a conductive layer on a substrate; and forming a darkening layer before, after, or both before and after forming the conductive layer, wherein the darkening layer includes a copper nitrate represented by $Cu_xO_yN_z$, and in the copper nitrate, x means an atomic content ratio of Cu, y means an atomic content ratio of O, z means an atomic content ratio of N, and $x>0$, $y>0$, $z>0$, and $[y/(x-3z)]<0.1$.

One embodiment of the present application provides a method for manufacturing a conductive structure body including forming a conductive pattern on a substrate; and forming a darkening pattern before, after, or both before and after forming the conductive pattern, wherein the darkening pattern includes a copper nitrate represented by $Cu_xO_yN_z$, and in the copper nitrate, x means an atomic content ratio of Cu, y means an atomic content ratio of O, z means an atomic content ratio of N, and $x>0$, $y>0$, $z>0$, and $[y/(x-3z)]<0.1$.

One embodiment of the present application provides a touch screen panel including the conductive structure body.

One embodiment of the present application provides a display device including the conductive structure body.

One embodiment of the present application provides a solar cell including the conductive structure body.

Advantageous Effects

A conductive structure body according to one embodiment of the present application may prevent reflection caused by a conductive layer without affecting conductivity of the conductive layer, and may enhance a concealing property of the conductive layer by improving absorbance. In addition, a touch screen panel having improved visibility, and a display device and a solar cell including the touch screen panel may be developed using the conductive structure body according to one embodiment of the present application.

BRIEF DESCRIPTION OF DRAWINGS

Each of FIG. 1 to FIG. 3 is one embodiment of the present application, and is a diagram illustrating a laminated structure of a conductive structure body including a conductive layer and a darkening layer.

Each of FIG. 4 to FIG. 6 is one embodiment of the present application, and is a diagram illustrating a laminated structure of a conductive structure body including a conductive pattern layer and a darkening pattern layer.

FIG. 7 is a graph measuring initial light reflectivity of examples and comparative examples according to Experimental Example 1.

FIG. 8 is a graph measuring light reflectivity of examples and comparative examples according to Experimental Example 1 after 120 hours pass by.

FIG. 9 is a graph showing initial light reflectivity of Example 1 according to Experimental Example 2-1 and light reflectivity thereof after 120 hours pass by.

FIG. 10 is a graph showing initial light reflectivity of Comparative Example 3 according to Experimental Example 2-2 and light reflectivity thereof after 48 hours and 148 hours pass by.

FIG. 11 is Table 1 that illustrates color changes according to Experimental Example 1 in the darkening layers of the conductive structure bodies according to the examples and the comparative examples.

FIG. 12 is Table 3 that illustrates color changes according to Experimental Example 2-1 in the darkening layer of Example 1.

FIG. 13 is Table 4 that illustrates color changes according to Experimental Example 2-2 in the darkening layer of Comparative Example 3.

BEST MODE

In the present application, a description of one member being placed "on" another member includes not only a case of the one member adjoining the another member but a case of still another member being present between the two members.

In the present application, a description of a certain part "including" certain constituents means capable of further including other constituents, and does not exclude other constituents unless particularly stated on the contrary.

Hereinafter, the present application will be described in more detail.

In the present specification, a display device is a term collectively referring to televisions, computer monitors or the like, and includes a display element forming an image and a case supporting the display element.

Examples of the display element include plasma display panels (PDP), liquid crystal displays (LCD), electrophoretic displays, cathode-ray tubes (CRT), OLED displays and the like. In the display element, an RGB pixel pattern for obtaining an image and an additional optical filter may be provided.

Meanwhile, relating to a display device, needs for a touch function in which a human hand directly becomes an input device without a separate input device such as a keyboard or a remote control have gradually increased as the propagation of smart phones, tablet PCs, IPTVs and the like has been accelerated. In addition, a multi-touch function capable of writing has been also required as well as specific point recognition.

Most touch screen panels (TSP) currently commercialized are based on a transparent conductive ITO thin film, but have problems such that a touch recognition speed becomes lower due to RC delay caused by relatively high surface resistance (minimum 150Ω/□, ELECRYSTA product manufactured by Nitto Denko Corporation) of a transparent ITO electrode itself when used in a large-area touch screen panel, and an additional compensation chip needs to be introduced in order to overcome this.

Inventors of the present application have studied a technology for replacing the transparent ITO thin film with a metal micro pattern. In view of the above, the inventors of the present invention have found out that, when Ag, Mo/Al/Mo, MoTi/Cu and the like, which are metal thin films having high electrical conductivity as an electrode of a touch screen panel, are used, glare and the like may occur due to high reflectivity and a haze value with respect to external light as well as a problem of a pattern being readily recognized by human eyes in terms of visibility due to high reflectivity, when a specific-shaped micro electrode pattern is to be obtained. In addition, the inventors of the present application have also found out that a high-priced target is required in the manufacturing process, or the process may often be complicated.

As a result, one embodiment of the present application is to provide a conductive structure body that may be differentiated from a touch screen panel using an existing ITO-based transparent conductive thin film layer, and may be used in a touch screen panel having an improved concealing property of a metal micro pattern electrode and having improved reflection and diffraction properties with respect to external light.

In the present specification, "conductivity" means electrical conductivity.

In addition, in the present specification, "reflectivity" means light reflectivity, and a "refractive index" means a light refractive index.

One embodiment of the present application provides a conductive structure body including a substrate; a conductive layer provided on the substrate; and a darkening layer provided on at least one surface of the conductive layer, wherein the darkening layer includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and $[y/(x-3z)]<0.1$.

In the present specification, the atomic content ratio may mean atomic % used in the art.

The $[y/(x-3z)]$ means the content of O with respect to the content of Cu that does not bind to N in the copper nitrate, and when the $[y/(x-3z)]$ has a value of 0.1 or greater, the darkening layer has a possibility of causing degeneration due to CuO phase formation and high temperature.

According to one embodiment of the present application, the $[y/(x-3z)]$ may have a value of 0.07 or less. More specifically, according to one embodiment of the present application, the $[y/(x-3z)]$ may have a value of 0.06 or less.

According to one embodiment of the present application, the copper nitrate may have a y+z value of 0.16 or less. Specifically, according to one embodiment of the present application, the copper nitrate may have a y+z value of 0.15 or less.

When the y+z has a value of 0.16 or less, the darkening layer has an advantage in that a darkening property is maintained even in a high temperature and high humidity environment.

According to one embodiment of the present specification, the darkening layer may have an average light reflectivity variation of 20% or less in a wavelength range of 380 nm to 780 nm after 120 hours pass by under an atmosphere of 85° C. and 85 RH. The light reflectivity variation may be presented as a light reflectivity increase rate, and when light reflectivity of the darkening layer greatly increases after going through the high temperature and high humidity atmosphere, it may mean that efficiency of the darkening layer is reduced.

Specifically, the darkening layer of the present specification has a light reflectivity increase in less than 20% even after 120 hours pass by under an atmosphere of 85° C. and 85 RH, therefore, efficiency of the darkening layer may be maintained under a harsh condition.

The light reflectivity variation (%) may be calculated by ((average light reflectivity after going through the high temperature and high humidity atmosphere/initial average light reflectivity)−1)×100.

The darkening layer in the present specification may be a patterned darkening pattern layer. In addition, the conductive layer in the present specification may be a patterned conductive pattern layer. The darkening layer may be patterned simultaneously or separately with the conductive layer.

The darkening layer in the present specification may be provided on at least one surface of the conductive layer. Specifically, the darkening layer may be provided on only one surface of the conductive layer, or on both surfaces of the conductive layer.

In the conductive structure body according to one embodiment of the present application, the conductive layer may be provided between a substrate and a darkening layer. Specifically, the conductive structure body may include a substrate; a conductive layer provided on the substrate; and a darkening layer provided on the conductive layer. In addition, according to one embodiment of the present application, the darkening layer may be provided on at least part of the upper surface and the side surface of the conductive layer. Specifically, when the conductive structure body is used in a display unit of an electronic device and is recognized from the outside through a surface opposite to the substrate, the darkening layer may play a role of preventing glare of the conductive layer.

In the conductive structure body according to one embodiment of the present application, the darkening layer may be provided between a substrate and a conductive layer. Specifically, the conductive structure body may include a substrate; a darkening layer provided on the substrate; and a conductive layer provided on the darkening layer. Specifically, when the conductive structure body is used in a display unit of an electronic device and is recognized from the outside through the substrate, the darkening layer may play a role of preventing glare of the conductive layer.

The darkening layer may not only play a role of preventing corrosion of the conductive layer, but also play a role of preventing a glare effect caused by the conductive layer when the conductive layer is used in a display unit of an electronic device.

The inventors of the present application have found out that, in a touch screen panel including a conductive metal micro pattern provided in an effective screen unit, light reflection and refraction properties by the pattern layer have a major influence on the visibility of the conductive metal micro pattern, and have made an effort to improve this. Specifically, in a touch screen panel based on existing ITO, a problem by reflectance of a conductive pattern has not been significantly revealed due to high transmittance of the ITO itself, however, in a touch screen panel including a conductive metal micro pattern provided in an effective screen unit, reflectance and a darkening property of the conductive metal micro pattern are important.

In a touch screen panel according to one embodiment of the present application, a darkening layer may be introduced in order to reduce the reflectance and improve the absorbance property of a conductive metal micro pattern. The darkening layer is capable of significantly improving a visibility decline problem caused by high reflectance of the conductive layer by being provided on at least one surface of the conductive layer in a touch screen panel.

Specifically, the darkening layer has a light absorbing property, therefore, is capable of reducing the reflectance caused by the conductive layer by reducing the amount of the light incident to the conductive layer itself and the amount of the light reflected from the conductive layer. In addition, the darkening layer may have low reflectance compared to the conductive layer. As a result, light reflectance may be reduced compared to a case in which a user directly looks at the conductive layer, and therefore, visibility of the conductive layer may be significantly improved.

In the present specification, the darkening layer means a layer capable of reducing the amount of the light incident to the conductive layer itself and the amount of the light reflected from the conductive layer by having a light absorbing property, and the darkening layer may be a patterned darkening pattern layer. The darkening layer may be expressed with a term such as a light absorbing property layer, a blackening layer, a blackening property layer and the like, and the patterned darkening pattern layer may be expressed with a term such as a light absorbing property pattern layer, a blackening pattern layer, a blackening property pattern layer and the like.

The conductive structure body including a darkening layer including a copper nitrate of the present application has improved effects compared to a conductive structure body including a darkening layer including a copper oxide. A darkening layer including a copper oxide has a problem in that reflectivity may increase with time since the darkening layer may be discolored under a high temperature and high humidity condition by a phase change of the copper oxide. However, in the darkening layer including a copper nitrate of the present application, the copper nitrate does not experience a phase change even under a high temperature and high humidity condition, and therefore, discoloration of the darkening layer may be prevented. Accordingly, when the darkening layer according to the present application is used, the darkening layer is not discolored under a high temperature and high humidity condition even after a long time passes by, and therefore, there is an advantage in that low reflectivity may be maintained, and a stable conductive structure body may be provided.

In one embodiment of the present application, a surface resistance of the conductive structure body including the patterned conductive layer and the patterned darkening layer may be greater than or equal to $1\Omega/\square$ and less than or equal to $300\Omega/\square$, specifically greater than or equal to $1\Omega/\square$ and less than or equal to $100\Omega/\square$, more specifically, greater than or equal to $1\Omega/\square$ and less than or equal to $50\Omega/\square$, and even more specifically greater than or equal to $1\Omega/\square$ and less than or equal to $20\ \Omega/\square$.

When the surface resistance of the conductive structure body is greater than or equal to $1\Omega/\square$ and less than or equal to $300\Omega/\square$, it is effective in replacing an existing transparent ITO electrode. When the surface resistance of the conductive structure body is greater than or equal to $1\Omega/\square$ and less than or equal to $100\Omega/\square$, or greater than or equal to $1\ \Omega/\square$ and less than or equal to $50\Omega/\square$, and particularly, when greater than or equal to $1\Omega/\square$ and less than or equal to $20\ \Omega/\square$, surface resistance is significantly lower compared to when an existing transparent ITO electrode is used, and therefore, a touch recognition speed may be significantly improved since RC delay is shortened when a signal is applied, and based on this, a use in a large area touch screen of 10 inch or larger may be readily accomplished.

In the conductive structure body, the surface resistance of the conductive layer or the darkening layer prior to being patterned may be greater than $0\Omega/\square$ and less than or equal to $10\Omega/\square$, greater than $0\Omega/\square$ and less than or equal to $2\Omega/\square$, and specifically, greater than $0\Omega/\square$ and less than or equal to $0.7\ \Omega/\square$. When the surface resistance is $2\Omega/\square$ or less and particularly is $0.7\Omega/\square$ or less, micro patterning design and manufacturing processes are smoothly progressed as the surface resistance of the conductive layer or the darkening layer prior to patterning is reduced, and it is effective in increasing the reaction speed of an electrode since the surface resistance of the conductive structure body is reduced after patterning. The surface resistance may be adjusted depending on the thickness of the conductive layer or the darkening layer.

In the conductive structure body according to one embodiment of the present application, an extinction coefficient k of the darkening layer may be greater than or equal to 0.2 and less than or equal to 2.5, and more specifically greater than or equal to 0.7 and less than or equal to 1.4 in light having a wavelength region of greater than or equal to 380 nm and less than or equal to 780 nm. When the extinction coefficient is greater than or equal to 0.7 and less than or equal to 1.4, reflectivity further decreases, and it is effective in further improving the degree of darkening of the darkening layer. In this case, a concealing property of the conductive layer is further improved, and visibility may be further improved when used in a touch screen panel.

In the conductive structure body according to one embodiment of the present application, an extinction coefficient k of the darkening layer may be greater than or equal to 0.8 and less than or equal to 1.4 in light having a wavelength region of greater than or equal to 380 nm and less than or equal to 680 nm.

In the conductive structure body according to one embodiment of the present application, an extinction coefficient k of the darkening layer is higher than cases using other materials such as an aluminum oxy-nitride or a copper oxide, therefore, there is an advantage in that the darkening layer may prepared to have a small thickness.

The extinction coefficient may be measured using an Ellipsometer measuring apparatus and the like known in the art.

The extinction coefficient k being 0.2 or greater is preferable in forming a darkening layer. The extinction coefficient k is also referred to as an absorption coefficient, and is a scale capable of defining how strong a conductive structure body absorbs light in a specific wavelength, and is a factor determining transmittance of a conductive structure body. For example, for transparent dielectric materials, a k value is very small with k<0.2. However, the k value increases as the content of metal components increases inside the material. If the content of metal components further increases, a metal in which transmission hardly occurs, and only surface reflection mostly occurs is obtained, and an extinction coefficient k becomes greater than 2.5, which is not preferable in forming a darkening layer.

In the conductive structure body according to one embodiment of the present application, a refractive index n of the darkening layer may be greater than 0 and less than or equal to 3 in light having a wavelength region of greater than or equal to 380 nm and less than or equal to 680 nm, and more specifically, greater than or equal to 2 and less than or equal to 3.3. Alternatively and even more specifically, a refractive index n of the darkening layer may be greater than or equal to 2.5 and less than or equal to 3.3 in light having a wavelength region of greater than or equal to 500 nm and less than or equal to 680 nm, and a refractive index n of the darkening layer may be greater than or equal to 3 and less than or equal to 3.3 in light having a wavelength region of 550 nm and less than or equal to 680 nm. When referring to the following Mathematical Equation 1, the thickness of a darkening layer may be determined depending on the refractive index.

$$d = \frac{\lambda}{4n} N (N = 1, 3, 5, \ldots )$$ [Mathematical Equation 1]

In Mathematical Equation 1,
d is a thickness of a darkening layer, n is a refractive index, and λ is a wavelength of light.

In the conductive structure body according to one embodiment of the present application, an extinction coefficient k of the darkening layer is higher in light having a long wavelength compared to cases using other materials such as an aluminum oxy-nitride or a copper oxide, therefore, there is an advantage in that the darkening layer may prepared to have a small thickness.

The conductive structure body according to one embodiment of the present application may have total reflectivity of 20% or less, specifically 15% or less, and more specifically 10% or less.

It is more effective as the reflectivity is smaller.

In one embodiment of the present application, the total reflectivity means reflectivity with respect to light having a wavelength range of greater than or equal to 300 nm and less than or equal to 800 nm, and specifically greater than or equal to 380 nm and less than or equal to 780 nm incident at 90° to the surface to measure after treating a surface opposite to the surface to measure with a black layer (perfect black). In the present specification, total reflectivity is a value measured based on light having a wavelength region of greater than or equal to 300 nm and less than or equal to 800 nm, and specifically greater than or equal to 380 nm and less than or equal to 780 nm among reflected light reflected by a pattern layer subject to light incidence or a conductive structure body when the incident light is employed as 100%.

When the darkening layer is provided between a conductive layer and a substrate, the reflectivity may be measured from the substrate side. When the total reflectivity is measured from the substrate side, the total reflectivity may be 20% or less, specifically 15% or less, and more specifically 10% or less. It is more effective as the total reflectivity is smaller.

In addition, when the conductive layer is provided between a substrate and a darkening layer, the reflectivity may be measured from a direction opposite to the surface at which the darkening layer adjoins the conductive layer. Specifically, when the darkening layer includes a first surface adjoining the conductive layer and a second surface opposite to the first surface, the reflectivity may be measured from the direction of the second surface. When measured from this direction, the total reflectivity may be 20% or less, specifically 15% or less, and more specifically 10% or less. It is more effective as the total reflectivity is smaller.

The conductive layer may be a conductive pattern layer, and the darkening layer may be a darkening pattern layer. Herein, when the total reflectivity of the conductive structure body is measured from the second surface side of the darkening pattern layer, the total reflectivity (Rt) of the conductive structure body may be calculated by the following Mathematical Equation 2.

Total reflectivity (Rt)=reflectivity of substrate+closure ratio×reflectivity of darkening layer    [Mathematical Equation 2]

In addition, in the case that the conductive structure body has a structure in which two types of conductive structure bodies are laminated, the total reflectivity (Rt) of the conductive structure body may be calculated by the following Mathematical Equation 3.

Total reflectivity (Rt)=reflectivity of substrate+closure ratio×reflectivity of darkening layer×2    [Mathematical Equation 3]

In Mathematical Equations 2 and 3, the total reflectivity of the substrate may be reflectivity of touch strengthened glass, and when the surface is a film, may be reflectivity of the film.

In addition, the closure ratio may be represented by the ratio of an area occupied by a region covered by a conductive pattern based on the flat surface of a conductive structure body, in other words, (1−opening ratio).

Accordingly, a difference between having a patterned darkening pattern layer and not having a patterned darkening pattern layer is dependent on the reflectivity of the patterned darkening pattern layer. In this regard, the total reflectivity (Rt) of the conductive structure body according to one embodiment of the present application may be reduced in 10% to 20%, may be reduced in 20% to 30%, may be reduced in 30% to 40%, may be reduced in 40% to 50%, and may be reduced in 50% to 70% compared to the total reflectivity (RO) of a conductive structure body having the same constitution except that the conductive structure body does not include the patterned darkening pattern layer. In other words, when the total reflectivity range varies from 1% to 30% while varying the closure ratio range from 1% to 10% in Mathematical Equations 2 and 3, a reflectivity decrease effect of maximum 70% may be exhibited, and a total reflectivity decrease effect of minimum 10% may be exhibited.

In the conductive structure body according to one embodiment of the present application, the patterned darkening layer includes a first surface adjoining the conductive pattern and a second surface opposite to the first surface, and when the total reflectivity of the conductive structure body is measured from the second surface side of the darkening pattern, a difference in the total reflectivity (Rt) of the conductive structure body and the reflectivity (R0) of the substrate may be 40% or less, 30% or less, 20% or less, and 10% or less.

In one embodiment of the present application, the conductive structure body may have a brightness value (L*) of or less based on the Commission Internationale de l'Eclairage (CIE) L*a*b* color coordinates, and more specifically, 40 or less. It is more effective as the brightness value is smaller since reflectivity decreases.

In one embodiment of the present application, there may be almost no pinholes in the conductive structure body, and even when the pinholes are present, the diameter may be 3 µm or less, and more specifically 1 µm or less. When the diameter of the pinholes is 3 µm or less in the conductive structure body, the occurrence of disconnection may be prevented. In addition, when there are almost no pinholes and the number of the pinholes is very small, the occurrence of disconnection may be prevented.

In one embodiment of the present application, the darkening layer may be patterned simultaneously or separately with the conductive layer.

In one embodiment of the present application, the patterned darkening layer and the patterned conductive layer may form a laminated structure using a simultaneous or separate patterning process. In this regard, the structure may be differentiated from a structure in which at least a part of a light absorbing material is sunk or dispersed in a conductive pattern, or a structure in which a part of the surface side of a single layer conductive pattern is physically or chemically modified by additional surface treatment.

In addition, in the conductive structure body according to one embodiment of the present application, the darkening layer may be provided directly on the substrate or the conductive layer without an adhesive layer or gluing layer in between. The adhesive layer or gluing layer may have an effect on durability or optical properties. Furthermore, the conductive structure body according to one embodiment of the present application has a completely different manufacturing method when compared to a case using an adhesive layer or gluing layer. Moreover, when compared to a case using an adhesive layer or gluing layer, the conductive structure body according to one embodiment of the present application may have an excellent interfacial property between the substrate or the conductive layer and the darkening layer.

In one embodiment of the present application, the darkening layer may be formed as a single layer, or formed as a multilayer of two or more layers.

In one embodiment of the present application, the darkening layer preferably has an achromatic color. Herein, an achromatic color means a color shown when light incident to the surface of an object is not selectively absorbed and is evenly reflected and absorbed with respect to the wavelength of each component.

In one embodiment of the present application, the darkening layer may further include at least one of a dielectric material and a metal. The metal may be a metal or an alloy of metals. Examples of the dielectric material may include $TiO_{2-w}$, $SiO_{2-w}$, $MgF_{2-w}$, $SiN_{1.3-w}$ ($-1 \leq w \leq 1$) and the like, but are not limited thereto. The metal may include a metal selected from among iron (Fe), cobalt (Co), titanium (Ti), vanadium (V), aluminum (Al), molybdenum (Mo), copper (Cu), gold (Au) and silver (Au), or may be an alloy of two or more metals selected from among iron (Fe), cobalt (Co), titanium (Ti), vanadium (V), aluminum (Al), molybdenum (Mo), copper (Cu), gold (Au) and silver (Au), but is not limited thereto.

According to one embodiment of the present application, the darkening layer may include a copper nitrate represented by $Cu_xO_yN_z$, and may further include at least one of the dielectric material and the metal described above.

In one embodiment of the present application, it is preferable that the dielectric material be distributed so that the content is reduced as being far away from a direction to which external light enters, and the metal and the alloy components be distributed to the contrary. Herein, the content of the dielectric material may be from 20% by weight to 50% by weight, and the content of the metal may be from 50% by weight to 80% by weight. In the case that the darkening layer further includes an alloy, the darkening layer may include the dielectric material in 10% by weight to 30% by weight, the metal in 50% by weight to 80% by weight and the alloy in 5% by weight to 40% by weight.

As another specific example, the darkening layer may further include any one or more of an alloy of nickel and vanadium, and an oxide, nitride, or oxy-nitride of nickel and vanadium. Herein, the vanadium may be included in 26 atomic % to 52 atomic %, and the atomic ratio of the vanadium with respect to the nickel is preferably from 26/74 to 52/48.

As another specific example, the darkening layer may further include a transition layer having two or more elements, and in which one elemental composition ratio increases by maximum 20% approximately per 100 angstroms depending on the direction to which external light enters. Herein, the one element may include a metal element such as nickel (Ni), vanadium (V), tungsten (W), tantalum (Ta), molybdenum (Mo), niobium (Nb), titanium (Ti), iron (Fe), chromium (Cr), cobalt (Co), aluminum (Al) or copper (Cu), and may include oxygen, nitrogen or carbon as an element other than the metal element.

As another specific example, the darkening layer may further include a first chromium oxide layer, a metal layer, a second chromium oxide layer and a chromium mirror, and herein, a metal selected from among nickel (Ni), vanadium (V), tungsten (W), tantalum (Ta), molybdenum (Mo), niobium (Nb), titanium (Ti), iron (Fe), cobalt (Co), aluminum (Al) and copper (Cu) may be included instead of chromium. The metal layer preferably has a thickness of 10 nm to 30 nm, the first chromium oxide layer preferably has a thickness of 35 nm to 41 nm, and the second chromium oxide layer preferably has a thickness of 37 nm to 42 nm.

As another specific example, the darkening layer may use a laminated structure of an alumina ($Al_2O_3$) layer, a chromium oxide ($Cr_2O_3$) layer and a chromium (Cr) layer. Herein, the alumina layer has an improved reflection property and a property of preventing light diffusion, and the chromium oxide layer may enhance a contrast property by reducing mirror surface reflectivity.

In one embodiment of the present application, the material of the conductive layer is suitably a material having specific resistance of $1 \times 10^{-6} \Omega \cdot cm$ to $30 \times 10^{-6} \Omega \cdot cm$, and preferably may be $1 \times 10^{-6} \Omega \cdot cm$ to $7 \times 10^{-6} \Omega \cdot cm$.

In the conductive structure body according to one embodiment of the present application, the material of the conductive layer preferably includes one, two or more selected from the group consisting of metals, metal alloys, metal oxides and metal nitrides. As the material of the conductive layer, a metal material having excellent conductivity and readily etched is better. However, materials having excellent electrical conductivity generally have a disadvantage of having high reflectance. However, a conductive layer may be formed using a material having high reflectance in the present application by using the darkening layer. Even in the cases that a material having reflectance of 70% or greater, or 80% or greater is used in the present application, reflectance may be reduced, a concealing property of the conductive layer may be enhanced, and a contrast property may be maintained or enhanced by adding the darkening layer.

In the conductive structure body according to one embodiment of the present application, the conductive layer may be a single film or a multilayer film.

In the conductive structure body according to one embodiment of the present application, specific examples of the material of the conductive layer may include one, two or more selected from the group consisting of copper (Cu), aluminum (Al), silver (Au), neodymium (Nd), molybdenum (Mo), nickel (Ni), an oxide thereof and a nitride thereof. The material of the conductive layer may be an alloy of two or more selected from the above-mentioned metals. More specifically, molybdenum, aluminum or copper may be included. Even more specifically, copper may be included. When the conductive layer is copper, the conductive layer includes the same metal as the darkening layer, therefore, a process may be carried out using the same etchant, which is advantageous in terms of a process, and is also advantages in terms of a production rate, therefore, there are advantages in the manufacturing process.

When the conductive layer includes copper, etching may be carried out at once when the darkening layer includes the copper nitrate represented by $Cu_xO_yN_z$, and there is an economical advantage in that efficiency is high and costs are reduced in the manufacturing process. In addition, copper has a specific resistance value of $1.7 \times 10^{-6} \Omega \cdot cm$, and is more advantageous than Al of which specific resistance value is $2.8 \times 10^{-6} \Omega \cdot cm$. Consequently, there is an advantage in that the conductive layer may be formed to be thinner than a case using Al in order to satisfy a surface resistance value of greater than $0\Omega/\square$ and less than or equal to $2\Omega/\square$, and preferably greater than $0\Omega/\square$ and less than or equal to $0.7\Omega/\square$. The surface resistance may be adjusted depending on the thickness of the conductive layer. For example, in order to satisfy surface resistance of $0.6\Omega/\square$ to $0.7\Omega/\square$, a thickness of 80 nm to 90 nm needs to be obtained for Al, however, a thickness of 55 nm to 65 nm is needed for Cu, therefore, it is more economical since the layer is capable of being formed to be thinner. In addition, Cu has a more excellent yield than Al by approximately 3 times in a sputtering process, therefore, an improvement by 3 times in the deposition rate may be theoretically expected. Accordingly, the conductive layer including Cu has an advantage in a manufacturing process in that efficiency is high and the process is economical.

In the conductive structure body according to one embodiment of the present application, the thickness of the darkening layer is specifically greater than or equal to 0.1 nm and less than or equal to 400 nm. More specifically, the thickness may be greater than or equal to 0.1 nm and less than or equal to 100 nm, and more specifically greater than or equal to 0.1 nm and less than or equal to 60 nm. A preferable thickness of the darkening layer may be different within the range of greater than or equal to 0.1 nm and less than or equal to 400 nm depending on a manufacturing process, however, when considering an etching property, a process control is relatively simple when the thickness is 0.1 nm or greater, and it may be relatively advantageous in terms of a process control and a production rate when the thickness is 60 nm or less. When the thickness of the darkening layer is greater than or equal to 0.1 nm and less than or equal to 400 nm, more specifically greater than or equal to 0.1 nm and less than or equal to 100 nm, and even more specifically greater than or equal to 0.1 nm and less than or equal to 60 nm, a darkening effect is excellent since average reflectivity may be 20% or less, specifically 15% or less, and more specifically 10% or less in a visible light wavelength region of 380 nm to 780 nm.

In one embodiment of the present application, the thickness of the conductive layer is not particularly limited, however, having a thickness of greater than or equal to 0.01 μm and less than or equal to 10 μm may exhibit excellent effects in terms of conductivity of the conductive layer and economic feasibility of the pattern forming process.

In the conductive structure body according to one embodiment of the present application, a pattern line width in the conductive pattern layer may be 10 μm or less. Herein, the darkening layer may have the same pattern shape with the conductive layer. However, the pattern size of the darkening pattern layer does not have to be completely the same as the pattern size of the conductive pattern layer, and a case in which the pattern line width in a darkening pattern layer is narrower or wider than the pattern line width in a conductive pattern layer is also included in the scope of the present application. Specifically, the pattern line width in the darkening pattern layer may be greater than or equal to 80% and less than or equal to 120% of the pattern line width in the conductive pattern layer. Alternatively, an area equipped with a pattern in the darkening pattern layer is specifically greater than or equal to 80% and less than or equal to 120% of an area equipped with a pattern in the conductive pattern layer. More specifically, a pattern shape of the darkening pattern layer is preferably a pattern shape having the same or a larger pattern line width compared to a pattern line width in the conductive pattern layer.

When the darkening pattern layer has a pattern shape having a larger line width than a line width of the conductive pattern layer, an effect of the darkening pattern layer screening the conductive pattern layer is bigger when a user looks, therefore, there is an advantage in that an effect caused by luster or reflection of the conductive pattern layer itself may be efficiently blocked. However, a target effect of the present application may also be achieved when a pattern line width in the darkening pattern layer is the same as a pattern line width in the conductive pattern layer.

In the conductive structure body according to one embodiment of the present application, a transparent substrate may be used as the substrate, however, the substrate is not particularly limited, and glass, a plastic substrate, a plastic film and the like may be used.

In one embodiment of the present application, a pattern line width in the conductive pattern layer may be greater than 0 μm and less than or equal to 10 μm, specifically greater than or equal to 0.1 μm and less than or equal to 10 μm, more specifically greater than or equal to 0.2 μm and less than or equal to 8 μm, and even more specifically greater than or equal to 0.5 μm and less than or equal to 5 μm.

In one embodiment of the present application, an opening ratio of the conductive pattern layer, that is, a ratio of an area not covered by a pattern may be 70% or greater, 85% or greater, and 95% or greater. In addition, an opening ratio of the conductive pattern layer may be from 90 to 99.9%, but is not limited thereto.

In one embodiment of the present application, the pattern of the conductive pattern layer may be a regular pattern or an irregular pattern.

As the regular pattern, pattern forms used in the art such as a mesh pattern may be used. The irregular pattern is not particularly limited, and may have a boundary line form of figures forming a voronoi diagram. When the irregular pattern and the patterned darkening layer are used together in the present application, a diffraction pattern of reflected light due to illumination having directivity may be removed by the irregular pattern, and influences due to light scattering may be minimized by the darkening pattern layer, therefore, problems in visibility may be minimized.

Examples of the conductive structure body according to one embodiment of the present application are shown in FIG. 1 to FIG. 6.

FIG. 1 to FIG. 3 are for illustrating a lamination order of a substrate, a conductive layer and a darkening layer, and the conductive layer and the darkening layer may have a pattern shape rather than a whole surface area when actually used for a micro transparent electrode of a touch screen panel and the like.

FIG. 1 illustrates a case in which the darkening layer (200) is disposed between the substrate (100) and the conductive layer (300). In this case, reflectance due to the conductive layer may be greatly reduced when a user looks at a touch screen panel from the substrate side.

FIG. 2 illustrates a case in which the darkening layer (200) is disposed on the conductive layer (300). In this case, reflectance due to the conductive layer may be greatly reduced when a user looks at a touch screen panel from a side opposite to the substrate side.

FIG. 3 illustrates a case in which the darkening layers (200, 220) are disposed both between the substrate (100) and the conductive layer (300), and on the conductive layer (300). In this case, reflectance due to the conductive layer may be greatly reduced when a user looks at a touch screen panel from both the substrate side and a side opposite to the substrate side.

In the descriptions of FIG. 1 to FIG. 3, the conductive layer may be a patterned conductive layer, and the darkening layer may be a patterned darkening layer.

FIG. 4 to FIG. 6 are diagrams each illustrating a laminated structure of the conductive structure body including the conductive pattern layer and the darkening pattern layer according to one embodiment of the present application.

The structure of the conductive structure body according to one embodiment of the present application may be a structure in which a substrate, a darkening layer, a conductive layer and a darkening layer are laminated in consecutive order. In addition, the conductive structure body may include an additional conductive layer and an additional darkening layer on the outermost darkening layer. In other words, the structure of the conductive structure body according to one embodiment of the present application may be selected from among a structure of a substrate/a darkening layer/a conductive layer, a structure of a substrate/a conductive layer/a darkening layer, a structure of a substrate/a darkening layer/a conductive layer/a darkening layer, a structure of a substrate/a conductive layer/a darkening layer/a conductive layer, a structure of a substrate/a darkening layer/a conductive layer/a darkening layer/a conductive layer/a darkening layer, a structure of a substrate/a conductive layer/a darkening layer/a conductive layer/a darkening layer/a conductive layer, a structure of a substrate/a darkening layer/a conductive layer/a darkening layer/a conductive layer/a darkening layer/a conductive layer, a structure of a substrate/a conductive layer/a darkening layer/a conductive layer/a darkening layer/a conductive layer/a darkening layer, a structure of a substrate/a darkening layer/a conductive layer/a darkening layer/a conductive layer/a darkening layer/a conductive layer/a darkening layer, a structure of a substrate/a conductive layer/a darkening layer/a conductive layer/a darkening layer/a conductive layer/a darkening layer/a conductive layer, and a structure of a substrate/a conductive layer/a darkening layer/a conductive layer/a darkening layer/a conductive layer/a darkening layer/a conductive layer.

In the description above, the conductive layer may be a conductive pattern layer, and the darkening layer may be a darkening pattern layer.

One embodiment of the present application provides a method for manufacturing a conductive structure body including preparing a conductive layer; forming a darkening layer on at least one surface of the conductive layer; and laminating the conductive layer or the darkening layer with a substrate, wherein the darkening layer includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and $[y/(x-3z)]<0.1$. The manufacturing method may further include separately or simultaneously patterning the conductive layer and the darkening layer.

One embodiment of the present application provides a method for manufacturing a conductive structure body including forming a conductive layer on a substrate; and forming a darkening layer before, after, or both before and after forming the conductive layer, wherein the darkening layer includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and $[y/(x-3z)]<0.1$.

In one embodiment of the present application, the method for manufacturing a conductive structure body may include forming a conductive layer on a substrate; and forming the darkening layer on the conductive layer. The manufacturing method may further include separately or simultaneously patterning the conductive layer and the darkening layer. Specifically, the conductive layer may be patterned after forming the conductive layer, and the darkening layer may be patterned after forming the darkening layer. In addition and specifically, the conductive layer and the darkening layer may be simultaneously patterned after forming the darkening layer.

In one embodiment of the present application, the method for manufacturing a conductive structure body may include forming the darkening layer on a substrate; and forming a conductive layer on the darkening layer. The manufacturing method may further include separately or simultaneously patterning the darkening layer and the conductive layer. Specifically, the darkening layer may be patterned after forming the darkening layer, and the conductive layer may be patterned after forming the conductive layer. In addition, the conductive layer and the darkening layer may be simultaneously patterned after forming the conductive layer.

In one embodiment of the present application, the method for forming a conductive structure body includes forming a first darkening layer on a substrate; forming a conductive layer on the darkening layer; and forming a second darkening layer on the conductive layer, wherein the first and the second darkening layers include a copper nitrate represented by $Cu_xO_yN_z$, and in the copper nitrate, x means an atomic content ratio of Cu, y means an atomic content ratio of O, z means an atomic content ratio of N, and x>0, y>0, z>0, and [y/(x−3z)]<0.1. The manufacturing method may include separately or simultaneously patterning the darkening layer and the conductive layer.

In the method for manufacturing a conductive structure body, the surface resistance of the conductive layer or the darkening layer prior to being patterned may be greater than 0 Ω/□ and less than or equal to 2Ω/□, and preferably greater than 0Ω/□ and less than or equal to 0.7Ω/□. When the surface resistance is 2Ω/□ or less, particularly, 0.7Ω/□ or less, micro patterning design and manufacturing processes are readily progressed as the surface resistance of the conductive layer or the darkening layer prior to patterning is lower, and it is effective in increasing the reaction rate of an electrode since the surface resistance of the conductive structure body is reduced after patterning.

One embodiment of the present application provides a method for manufacturing a conductive structure body including forming a conductive pattern on a substrate; and forming a darkening pattern before, after, or both before and after forming the conductive pattern, wherein the darkening pattern includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and [y/(x−3z)]<0.1.

The method for manufacturing a conductive structure body according to one embodiment of the present application may include forming a conductive pattern on a substrate; and forming the darkening pattern after forming the conductive pattern.

The method for manufacturing a conductive structure body according to one embodiment of the present application may include forming the darkening pattern on a substrate; and forming a conductive pattern after forming the darkening pattern.

One embodiment of the present application provides a method for manufacturing a conductive structure body including forming a conductive pattern on a substrate; and forming a darkening pattern before, after, or both before and after forming the conductive pattern, wherein the darkening pattern includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and [y/(x−3z)]<0.1.

In the method for manufacturing a conductive structure body, the descriptions on the conductive structure body, the conductive layer, the darkening layer, the conductive pattern layer and the darkening pattern layer are the same as those made above.

In one embodiment of the present application, the conductive pattern or the darkening pattern may be formed using methods known in the art. For example, methods such as evaporation, sputtering, wet coating, vaporization, electroplating or electroless plating and metal foil lamination may be used for the formation, and specifically, a sputtering method may be used for the formation.

For example, when forming a conductive layer including Cu and the darkening layer including a copper nitrate represented by $Cu_xO_yN_z$, and using an inert gas, for example, a gas such as Ar as a sputtering gas, there is an advantage obtained by using a Cu oxy-nitride single material sputtering target. By using a single material target, the process is readily controlled since partial pressure control of a reactive gas is not required, and in forming a final conductive structure body, there is also an advantage in that etching may be carried out at once using a Cu etchant. Alternatively, the process may also be carried out with partial pressure control of a reactive gas such as $O_2$ when using a reactive sputtering method.

In one embodiment of the present application, the method of forming a conductive pattern layer is not particularly limited, and for example, the conductive pattern layer may be formed using a direct printing method, and a method of forming a conductive layer and then patterning the conductive layer may also be used.

In one embodiment of the present application, when the conductive pattern layer is formed using a printing method, an ink or paste of a conductive material may be used, and the paste may further include a binder resin, a solvent, a glass frit and the like in addition to the conductive material.

In the case of forming a conductive layer and then patterning the conductive layer, a material having an etching resist property may be used.

In one embodiment of the present application, the conductive layer may be formed using a method such as evaporation, sputtering, wet coating, vaporization, electroplating or electroless plating and metal foil lamination. As the method for forming the conductive layer, a method of coating a solution of an organic metal, a nano metal or a composite thereof on a substrate, and giving conductivity by baking and/or drying the result may also be used. Organic silver may be used as the organic metal, and nano silver particles and the like may be used as the nano metal.

In one embodiment of the present application, the patterning of the conductive layer may use a method using a etching resist pattern. The etching resist pattern may be formed using a printing method, a photolithography method, a photography method, a method using a mask or laser transfer, for example, thermal transfer imaging, and the like, and a printing method or a photolithography method is more preferable, however, the method is not limited thereto. The conductive thin film layer may be etched and patterned using the etching resist pattern, and the etching resist pattern may be readily removed using a strip process.

One embodiment of the present application provides a touch screen panel including the conductive structure body. For example, in a capacitive type touch screen panel, the conductive structure body according to one embodiment of the present application may be used as a touch sensitive electrode substrate.

One embodiment of the present application provides a display device including the touch screen panel.

The touch screen panel according to one embodiment of the present application may further include an additional structure body besides the conductive structure body including the substrate, the conductive pattern layer and the darkening pattern layer described above. In this case, the two structure bodies may be disposed in the same direction, or the two structure bodies may be disposed in the opposite direction. The two or more structure bodies capable of being included in the touch screen panel of the present application do not necessarily have the same structure, and it is favorable that any one, preferably the structure body closest to a user, only includes the substrate, the conductive pattern layer and the darkening pattern layer described above, and the structure body additionally included does not necessarily include the darkening pattern layer. In addition, the lamination structures in the two or more structure bodies may be different from each other. When two or more structure bodies are included, an insulation layer may be provided therebetween. Herein, the insulation layer may additionally have a function of an adhesion layer.

The touch screen panel according to one embodiment of the present application may include a lower substrate; an upper substrate; and an electrode layer provided on any one or both sides of the surface of the lower substrate adjoining the upper substrate and the surface of the upper substrate adjoining the lower substrate. The electrode layers may each have a function of X axis location detection and Y axis location detection.

Herein, one or both of the electrode layers provided on the lower substrate and the surface of the lower substrate adjoining the upper substrate; and the electrode layer provided on the upper substrate and the surface of the upper substrate adjoining the lower substrate may be the conductive structure body according to one embodiment of the present application described above. When only one of the electrode layers is the conductive structure body according to the present application, the other may have a conductive pattern known in the art.

When two electrode layers are formed by providing electrode layers on one surface of both the upper substrate and the lower substrate, an insulation layer or a spacer may be provided between the lower substrate and the upper substrate so that a constant distance is maintained between the electrode layers and connection does not occur. The insulation layer may include an adhesive or a UV or heat curable resin. The touch screen panel may further include a ground connection unit connected to the pattern of the conductive layer in the conductive structure body described above. For example, the ground connection unit may be formed on the edge portion of a surface on which the pattern of the conductive layer of the substrate is formed. In addition, at least one of an anti-reflection film, a polarizing film, a fingerprint resistance film may be provided on at least one surface of a laminate including the conductive structure body. Other types of functional films may be further included besides the functional films described above depending on design specifications. Such a touch screen panel may be used in a display device such as an OLED display panel, a liquid crystal display (LCD), a cathode-ray tube (CRT) and a PDP.

In the touch screen panel according to one embodiment of the present application, a conductive pattern layer and a darkening pattern layer may be each provided on both surfaces of the substrate.

The touch screen panel according to one embodiment of the present application may additionally include an electrode unit or a pad unit on the conductive structure body, and herein, the effective screen unit, the electrode unit and the pad unit may be formed with the same conductor.

In the touch screen panel according to one embodiment of the present application, the darkening pattern layer may be provided on the side at which a user looks.

One embodiment of the present application provides a display device including the conductive structure body. In the display device, the conductive structure body according to one embodiment of the present application may be used in a color filter substrate, a thin-film transistor substrate or the like.

One embodiment of the present application provides a solar cell including the conductive structure body. For example, a solar cell may include an anode electrode, a cathode electrode, a photoactive layer, a hole transfer layer and/or an electron transfer layer, and the conductive structure body according to one embodiment of the present application may be used as the anode electrode and/or the cathode electrode.

The conductive structure body may substitute existing ITO in a display device or a solar cell, and may have a potential application in flexible products. In addition, the conductive structure body may be used as a next-generation transparent electrode together with a CNT, a conductive polymer, graphene and the like.

[Mode for Invention]

Hereinafter, the present application will be described in detail with reference to examples, comparative examples and experimental examples. However, the following examples are for illustrative purposes only, and the scope of the present invention is not limited thereto.

EXAMPLE 1

A conductive structure body was manufactured by depositing a darkening layer of $Cu_xO_yN_z$ (x=90, y=5, z=5) having a thickness of 29 nm on a Cu electrode having a thickness of 80 nm as a conductive layer using a reactive sputtering method.

EXAMPLE 2

A conductive structure body was manufactured by depositing a darkening layer of $Cu_xO_yN_z$ (x=85, y=3, z=12) having a thickness of 29 nm on a Cu electrode having a thickness of 80 nm as a conductive layer using a reactive sputtering method.

COMPARATIVE EXAMPLE 1

A conductive structure body was manufactured by depositing a darkening layer of $Cu_xO_yN_z$ (x=83, y=6, z=11) having a thickness of 29 nm on a Cu electrode having a thickness of 80 nm as a conductive layer using a reactive sputtering method.

COMPARATIVE EXAMPLE 2

A conductive structure body was manufactured by depositing a darkening layer of $Cu_xO_yN_z$ (x=81, y=8, z=11) having a thickness of 29 nm on a Cu electrode having a thickness of 80 nm as a conductive layer using a reactive sputtering method.

EXPERIMENTAL EXAMPLE 1

For the conductive structure bodies according to Examples 1 and 2, and Comparative Examples 1 and 2, changes in the darkening layers after 120 hours under an atmosphere of 85° C. and 85% RH were measured. Specifically, color changes in the darkening layers after 120 hours under an atmosphere of 85° C. and 85% RH, and average light reflectivity variations in a wavelength range of 380 nm to 780 nm were measured.

Color changes according to Experimental Example 1 in the darkening layers of the conductive structure bodies according to the examples and the comparative examples are as shown in Table 1 provided in FIG. 11.

Light reflectivity increase rates according to Experimental Example 1 of the conductive structure bodies according to the examples and the comparative examples are as shown in the following Table 2.

TABLE 2

| # | x/y/z | Light Reflectivity (%) | | Light Reflectivity Increase Rate |
|---|---|---|---|---|
| | | Initial | 85° C./85% 120 hr | |
| Example 1 | 90/5/5 | 12.9% | 11.0% | −14.7% |
| Example 2 | 85/3/12 | 16.7% | 19.2% | 15.0% |
| Comparative Example 1 | 83/6/11 | 17.2% | 39.0% | 126.7% |
| Comparative Example 2 | 81/8/11 | 20.1% | 59.8% | 197.5% |

FIG. 7 is a graph measuring initial light reflectivity of the examples and the comparative examples according to Experimental Example 1.

FIG. 8 is a graph measuring light reflectivity of the examples and the comparative examples according to Experimental Example 1 after 120 hours pass by.

In the results of Experimental Example 1, it can be seen that, when the copper nitrate composition satisfied [y/(x−3z)]<0.1, color changes in the darkening layer were small, and furthermore, light reflectivity increase rates were significantly small.

COMPARATIVE EXAMPLE 3

A conductive structure body was manufactured by forming a CuO (mass ratio of Cu:O is 95:5) intermediate layer to a thickness of 15 nm on a Cu electrode, which is a conductive layer and has a thickness of 80 nm, using a reactive sputtering method, and then forming a CuO (mass ratio of Cu:O is 60:40) darkening layer to a thickness of 55 nm on the intermediate layer.

EXPERIMENTAL EXAMPLE 2-1

For the conductive structure body according to Example 1, changes in the darkening layer after 120 hours under an atmosphere of 85° C. and 85% RH were measured. Specifically, color changes in the darkening layer after 120 hours under an atmosphere of 85° C. and 85% RH, and average light reflectivity variations in a wavelength range of 380 nm to 780 nm were measured. Herein, color changes in the darkening layer and average light reflectivity variations when OCA was not laminated on the conductive structure body and when OCA was laminated on the conductive structure body were measured.

Color changes according to Experimental Example 2-1 in the darkening layer of Example 1 are shown in Table 3 provided in FIG. 12.

FIG. 9 is a graph showing initial light reflectivity of Example 1 according to Experimental Example 2-1 and light reflectivity thereof after 120 hours pass by. Herein, the initial reflectivity value was expressed as O H, and the reflectivity value after 120 hours was expressed as After 120 H.

EXPERIMENTAL EXAMPLE 2-2

For the conductive structure body according to Comparative Example 3, changes in the darkening layer after 48 hours and 148 hours under an atmosphere of 85° C. and 85% RH were measured. Specifically, color changes in the darkening layer after 148 hours under an atmosphere of 85° C. and 85% RH, and average light reflectivity variations in a wavelength range of 380 nm to 780 nm were measured. Herein, color changes in the darkening layer and average light reflectivity variations when OCA was not laminated on the conductive structure body and when OCA was laminated on the conductive structure body were measured.

Color changes according to Experimental Example 2-2 in the darkening layer of Comparative Example 3 are as shown in Table 4 provided in FIG. 13.

FIG. 10 is a graph showing initial light reflectivity of Comparative Example 3 according to Experimental Example 2-2 and light reflectivity thereof after 48 hours and 148 hours pass by.

From the results in Table 4 and FIG. 10, it can be predicted that the results after 120 hours under an atmosphere of 5° C. and 85% RH were present between the results after 148 hours and the results after 48 hours in Experimental Example 2-2.

In the results of Experimental Examples 2-1 and 2-2, it can be seen that the CuO darkening layer experienced a big efficiency drop under a high temperature and high humidity atmosphere compared to the darkening layer according to Example 1.

As seen from the results of Experimental Examples 1 and 2, it can be seen that the conductive structure body according to the present application prevents reflection caused by a conductive layer while not affecting the conductivity of the conductive layer, and enhances a concealing property of the conductive layer by enhancing absorbance. In addition, a touch screen panel having improved visibility and a display device and a solar cell including the touch screen panel may be developed using the conductive structure body according to the present application.

Those having common knowledge in the field to which the present application belongs can perform various applications and modifications within the scope of the present application based on the descriptions made above.

DESCRIPTION OF REFERENCE NUMERALS

100: Substrate
200: Darkening layer
220: Darkening layer
300: Conductive Layer
201: Darkening Pattern Layer
221: Darkening Pattern Layer
301: Conductive Pattern Layer

The invention claimed is:
1. A conductive structure body comprising:
a substrate;
a conductive layer provided on the substrate; and
a darkening layer provided on at least one surface of the conductive layer,
wherein the darkening layer includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and [y/(x−3z)]<0.1, wherein the copper nitrate has a y+z value of 0.16 or less, wherein the darkening layer has an average light reflectivity variation of 20% or less in a wavelength range of 380 nm to 780 nm after 120 hours pass by under an atmosphere of 85° C. and 85 RH, and wherein a thickness of the darkening layer is greater than or equal to 0.1 nm and less than or equal to 60 nm.

2. The conductive structure body of claim 1, wherein an extinction coefficient k of the darkening layer is greater than or equal to 0.2 and less than or equal to 1.5 in light having a wavelength region of greater than or equal to 380 nm and less than or equal to 780 nm.

3. The conductive structure body of claim 1, wherein a refractive index n of the darkening layer is greater than or equal to 2 and less than or equal to 3.3 in light having a wavelength region of greater than or equal to 380 nm and less than or equal to 780 nm.

4. The conductive structure body of claim 1, wherein a total reflectivity of the conductive structure body is 20% or less.

5. The conductive structure body of claim 1, wherein a thickness of the conductive layer is from 0.01 μm to 10 μm.

6. The conductive structure body of claim 1, wherein the conductive layer is a patterned conductive pattern layer, and the darkening layer is a patterned darkening pattern layer.

7. The conductive structure body of claim 6, wherein a pattern line width in the conductive pattern layer is 10 μm or less.

8. The conductive structure body of claim 6, wherein a surface resistance of the conductive structure body is greater than or equal to 1Ω/□ and less than or equal to 300Ω/□.

9. The conductive structure body of claim 1, wherein the conductive layer includes one, two or more materials selected from the group consisting of metals, metal alloys, metal oxides and metal nitrides, and the material has specific resistance of $1 \times 10^{-6} \Omega \cdot cm$ to $30 \times 10^{-6} \Omega \cdot cm$.

10. The conductive structure body of claim 1, wherein a structure of the conductive structure body is selected from the group consisting of a structure of a substrate/a darkening layer/a conductive layer, a structure of a substrate/a conductive layer/a darkening layer, a structure of a substrate/a darkening layer/a conductive layer/a darkening layer, a structure of a substrate/a conductive layer/a darkening layer/a conductive layer, a structure of a substrate/a darkening layer/a conductive layer/a darkening layer/a conductive layer, a structure of a substrate/a conductive layer/a darkening layer/a conductive layer/a darkening layer, a structure of a substrate/a darkening layer/a conductive layer/a darkening layer/a conductive layer/a darkening layer, a structure of a substrate/a conductive layer/a darkening layer/a conductive layer/a darkening layer/a conductive layer, a structure of a substrate/a darkening layer/a conductive layer/a darkening layer/a conductive layer/a darkening layer/a conductive layer, and a structure of a substrate/a conductive layer/a darkening layer/a conductive layer/a darkening layer/a conductive layer/a darkening layer/a conductive layer.

11. A touch screen panel comprising the conductive structure body of claim 1.

12. A display device comprising the conductive structure body of claim 1.

13. A solar cell comprising the conductive structure body of claim 1.

14. A method for manufacturing a conductive structure body comprising:

forming a conductive layer on a substrate; and forming a darkening layer before, after, or both before and after forming the conductive layer, wherein the darkening layer includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and [y/(x−3z)]<0.1, wherein the copper nitrate has a y+z value of 0.16 or less, wherein the darkening layer has an average light reflectivity variation of 20% or less in a wavelength range of 380 nm to 780 nm after 120 hours pass by under an atmosphere of 85° C. and 85 RH, and wherein a thickness of the darkening layer is greater than or equal to 0.1 nm and less than or equal to 60 nm.

15. The method for manufacturing a conductive structure body of claim 14, further comprising separately or simultaneously patterning the conductive layer and the darkening layer.

16. The method for manufacturing a conductive structure body of claim 14, wherein the step of forming a darkening layer uses a reactive sputtering method.

17. A method for manufacturing a conductive structure body comprising:

forming a conductive pattern on a substrate; and forming a darkening pattern before, after, or both before and after forming the conductive pattern, wherein the darkening pattern includes a copper nitrate represented by $Cu_xO_yN_z$, and in the copper nitrate, x means an atomic content ratio of Cu, y means an atomic content ratio of O, z means an atomic content ratio of N, and x>0, y>0, z>0, and [y/(x−3z)]<0.1, wherein the copper nitrate has a y+z value of 0.16 or less, wherein the darkening layer has an average light reflectivity variation of 20% or less in a wavelength range of 380 nm to 780 nm after 120 hours pass by under an atmosphere of 85° C. and 85 RH, and wherein a thickness of the darkening layer is greater than or equal to 0.1 nm and less than or equal to 60 nm.

* * * * *